United States Patent
Nakai et al.

(10) Patent No.: US 9,550,461 B2
(45) Date of Patent: Jan. 24, 2017

(54) SHIELDED PIPE FOR A VEHICLE

(71) Applicant: SUMITOMO WIRING SYSTEMS, LTD., Yokkaichi, Mie (JP)

(72) Inventors: Hirokazu Nakai, Mie (JP); Takeo Maruchi, Mie (JP)

(73) Assignee: SUMITOMO WIRING SYSTEMS, LTD., Mie (JP)

( * ) Notice: Subject to any disclaimer, the term of this patent is extended or adjusted under 35 U.S.C. 154(b) by 0 days.

(21) Appl. No.: 15/022,741

(22) PCT Filed: Sep. 16, 2014

(86) PCT No.: PCT/JP2014/074422
§ 371 (c)(1),
(2) Date: Mar. 17, 2016

(87) PCT Pub. No.: WO2015/049980
PCT Pub. Date: Apr. 9, 2015

(65) Prior Publication Data
US 2016/0229358 A1  Aug. 11, 2016

(30) Foreign Application Priority Data
Oct. 4, 2013 (JP) .................. 2013-209603

(51) Int. Cl.
H01B 9/02 (2006.01)
B60R 16/02 (2006.01)
(Continued)

(52) U.S. Cl.
CPC ............ B60R 16/0215 (2013.01); H01B 3/30 (2013.01); H01B 9/023 (2013.01);
(Continued)

(58) Field of Classification Search
None
See application file for complete search history.

(56) References Cited

U.S. PATENT DOCUMENTS 8,546,691 B2 * 10/2013 Watanabe .............. H01B 11/18
174/102 R
2014/0182881 A1 * 7/2014 Huang ............... H01B 11/1091
174/103

FOREIGN PATENT DOCUMENTS

JP    H05-43715 U    6/1993
JP    2004158618 A   6/2004
(Continued)

OTHER PUBLICATIONS

Nov. 25, 2014 Search Report issued in International Patent Application No. PCT/JP2014/074422.

Primary Examiner — Dimary Lopez Cruz
(74) Attorney, Agent, or Firm — Oliff PLC

(57) ABSTRACT

A weight can be reduced, and a desired bent shape can be easily obtained with the shielded pipe of the present application. An electric wire that connects a battery and an inverter is inserted into a shielded pipe arranged underneath a floor of a vehicle. The shielded pipe has a pipe body that is made of a synthetic resin material and shaped into a predetermined shape. After the pipe body is shaped, a shielding portion is formed by spirally winding a ribbon-shaped metal foil around the outer circumferential surface of the pipe body. Furthermore, the shielding portion is inserted into a heat-shrinkable tube. The heat-shrinkable tube is heated and covers the outer circumferential surface of the shielding portion in a tight contact state, thus constituting a protective portion for protecting the shielding portion.

3 Claims, 4 Drawing Sheets

(51) Int. Cl.
    *H01B 11/10*     (2006.01)
    *H02G 3/04*     (2006.01)
    *H01B 3/30*     (2006.01)
    *H05K 9/00*     (2006.01)
    *H02G 3/06*     (2006.01)

(52) U.S. Cl.
    CPC ....... *H01B 11/1025* (2013.01); *H02G 3/0481* (2013.01); *H05K 9/0098* (2013.01); *H02G 3/06* (2013.01)

(56) References Cited

FOREIGN PATENT DOCUMENTS

| | | | |
|---|---|---|---|
| JP | 2007081158 | A | 3/2007 |
| JP | 2010246296 | A | 10/2010 |
| JP | 2013165561 | A | 8/2013 |

\* cited by examiner

SHIELDED PIPE FOR A VEHICLE

TECHNICAL FIELD

The present application relates to a shielded pipe.

BACKGROUND ART

In hybrid vehicles, for example, a battery that is mounted in a rear portion of the vehicle and an inverter that is mounted in an engine room of the vehicle are connected to each other using an electric wire. This electric wire is inserted into a shielded pipe to prevent noises superposed on the electric wire from adversely affecting the outside.

As disclosed in JP-A-2007-81158, such a shielded pipe is generally made of metal (such as aluminum alloy, for example). The shielded pipe is arranged along the lower surface of the vehicle and bent into a predetermined shape. Because the two end portions of the shielded pipe should be able to be freely bent, braided wires are connected to the two end portions of the shielded pipe. The electric wire is connected to the battery and the inverter through the braided wires.

SUMMARY

Technical Problem

However, since a conventional shielded pipe is typically made of metal (as mentioned above), the weight of the shielded pipe can be heavy. Moreover, it can be difficult to perform the bending process when a shielded pipe is composed of metal. One might think that a possible solution to this problem would be to merely reduce the overall thickness of the shielded pipe. However, this is not a practical solution, since the bent portion is flattened (crushed) and it therefore becomes difficult to ensure a space for accommodating the electric wire.

It is therefore an object of this application to provide a shielded pipe that is both light in weight and is easily bent into a desired shape.

Solution to Problem

A shielded pipe according to an aspect of the present application is a shielded pipe into which an electric wire is insertable, the shielded pipe including: a pipe body made of a synthetic resin material; a shielding portion formed by winding a metal foil around an outer circumferential surface of the pipe body; and a protective portion formed on an outer circumference of the shielding portion, wherein the shielding portion is formed by winding a plurality of sheet-like metal foils around the pipe body with the sheet-like metal foils being successively seamed together, the pipe body including a straight region and a bent region, the sheet-like metal foils having a longer width being wound around the straight region and the sheet-like metal foils having a shorter width being wound around the bent region.

Advantageous Effects

With the shielded pipe of the present application, the shielding portion is formed by winding the sheet-like metal foils such that the sheet-like metal foils are successively seamed together, and therefore, the time to wind the sheet-like metal foils is shorter than the time to spirally wind the ribbon-shaped metal foil. Furthermore, since the sheet-like metal foils having a longer width are used in the straight region of the pipe body and the sheet-like metal foils having a shorter width are used in the bent region, the sheet-like metal foils can be finely wound following the outline shape of the pipe body.

DESCRIPTION OF EMBODIMENTS

Preferred embodiments of the present application will be described below.

(1) The protective portion may be constituted by a heat-shrinkable tube that sheathes the pipe body.

With this configuration, it is possible to prevent corrosion in the shielding portion by covering the shielding portion with the heat-shrinkable tube.

(2) Moreover, the protective portion may be a film that is laminated on the outer circumferential surface of the shielding portion and has a rustproofing function.

It is also possible to prevent corrosion in the shielding portion using the laminated film.

Embodiment 1

Next, Embodiment 1 in which a shielded pipe of the present application is embodied will be described with reference to the drawings. This embodiment is applied to a wire harness WH that connects a battery 3 mounted in a compartment on the rear side of the vehicle and an inverter 4 mounted in an engine room of the vehicle.

The wire harness WH includes a plurality of electric wires. A predetermined section of the wire harness WH in the length direction is inserted into a shielded pipe 1. The shielded pipe 1 is arranged underneath the floor of the vehicle body and bent into a predetermined bent shape.

A first end of each of the metal braided portions 2 is connected to an end portion of the shielded pipe 1, respectively, and a second end of each of the metal braided portions 2 is connected to either the battery 3 or the inverter 4, respectively.

Figure 1:
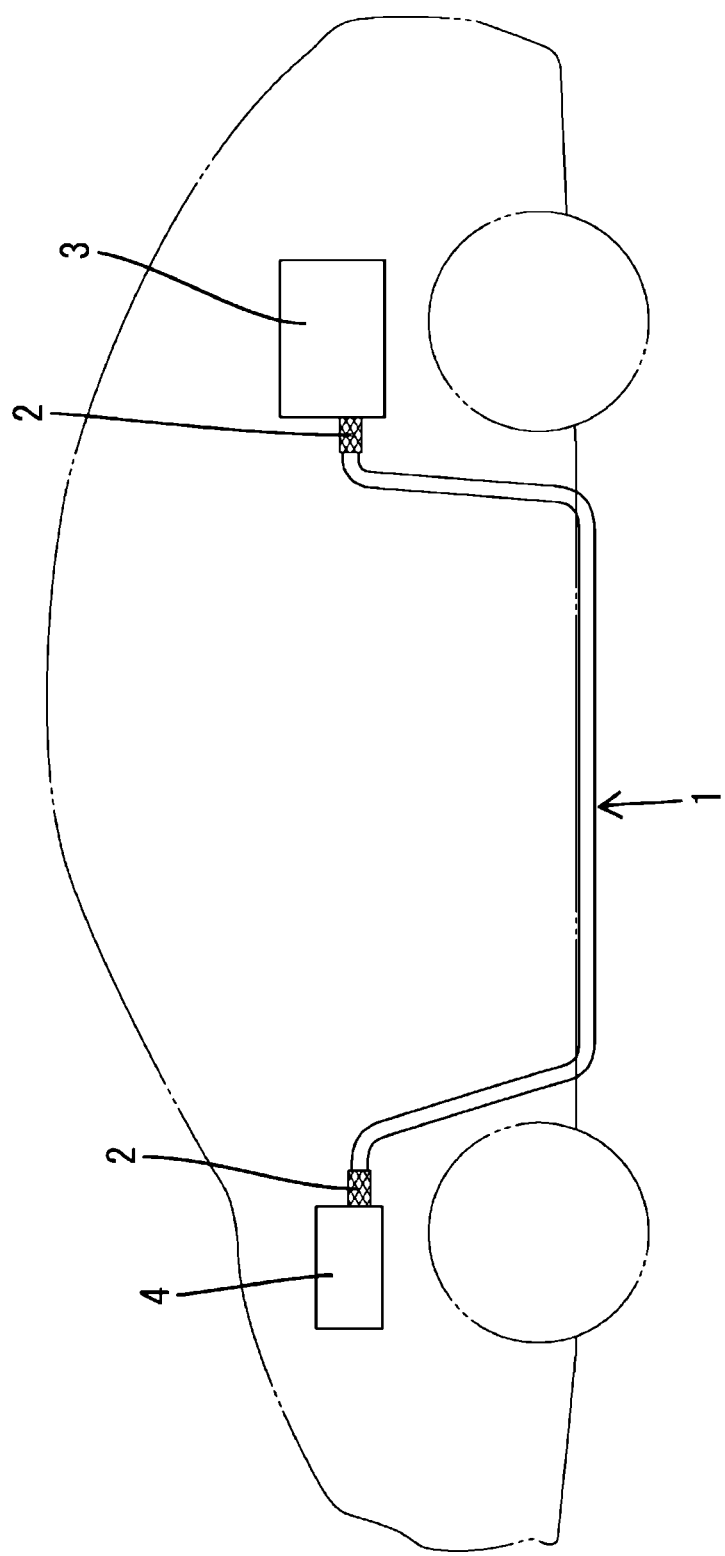
FIG. 1 is a diagram showing an outline of an arrangement state of a shielded pipe according to Embodiment 1.
Figure 2:
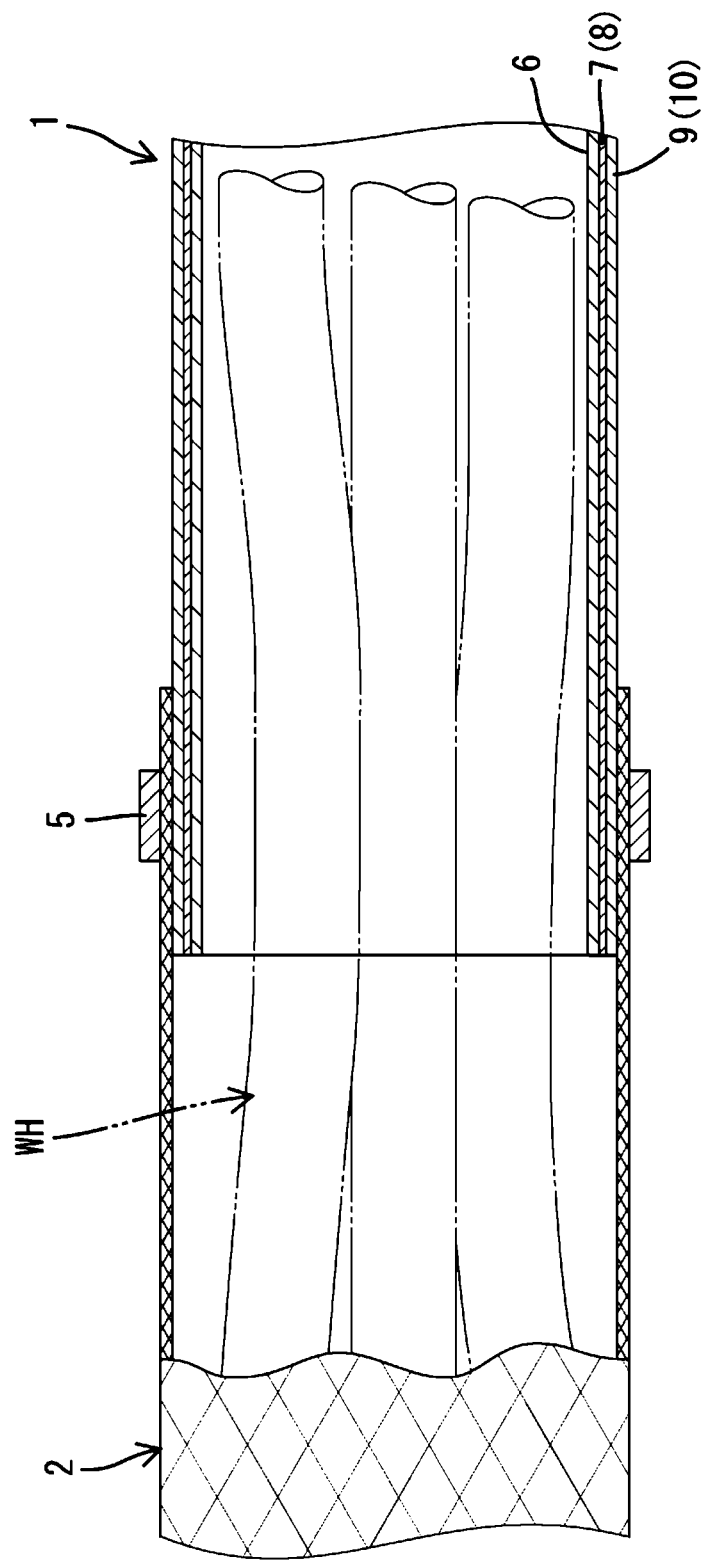
FIG. 2 is a cross-sectional side view showing a connection portion where the shielded pipe and a metal braided portion are connected to each other.

The metal braided portions 2 are formed by braiding copper-based individual metal wires whose surface is plated with tin into a mesh structure having, for example, an elongated tubular shape. The wire harness WH drawn out from the shielded pipe 1 is inserted into the metal braided portions 2. Terminal fittings (not shown) are connected to the end portions of the electric wires included in the wire harness WH. As shown in FIG. 2, the first end portion of the metal braided portion 2 is connected and fixed to the end portion of the shielded pipe 1 using a crimping ring 5.

Figure 4:
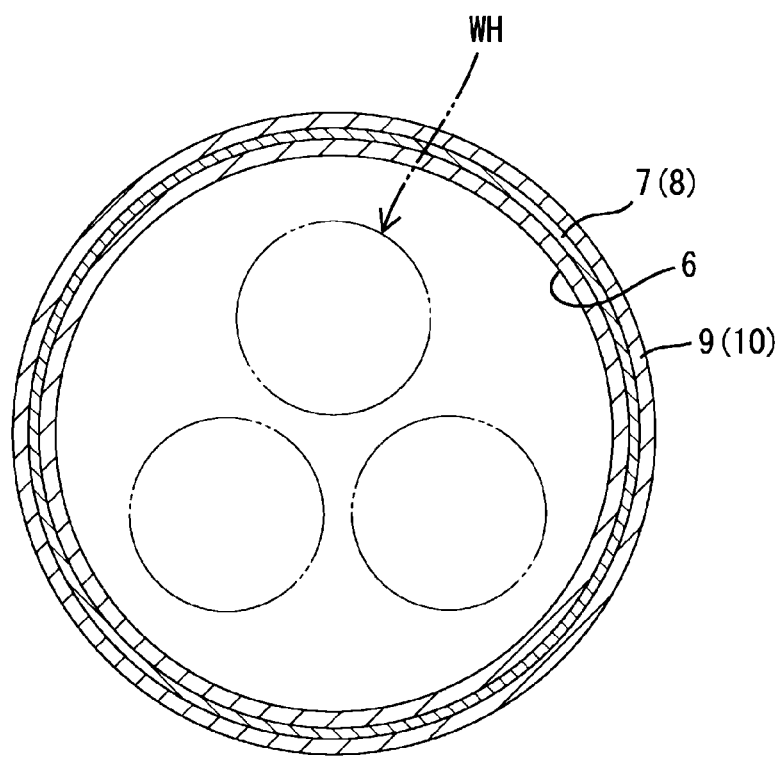
FIG. 4 is a cross-sectional view showing a structure of the shielded pipe.

As shown in FIG. 4, the shielded pipe 1 of Embodiment 1 has a three-layer structure. A pipe body 6 is arranged on the innermost layer side. The pipe body 6 is made of a synthetic resin and is formed into an elongated pipe shape that has two open ends. The pipe body 6 extends roughly in a front-rear direction of the vehicle, but it is partially bent three-dimensionally to bypass projecting portions and recessed portions underneath the floor of the vehicle or to follow projections and recesses.

A shielding portion 7 for providing the shielded pipe 1 with a shielding function is arranged in the intermediate layer of the shielded pipe 1. The shielding portion 7 is formed by spirally winding a ribbon-shaped metal foil 8 around the outer circumferential surface of the above-mentioned pipe body 6. The winding of the metal foil 8 starts at one end of the outer circumferential surface of the pipe body 6 in the longitudinal direction, and ends at the other end. The metal foil 8 is made of an aluminum alloy, for example, and a bonding layer that can adhere to the outer circumferential surface of the pipe body 6 is formed on its back surface. In this embodiment, the lateral edges of the ribbon-shaped metal foil 8 overlap each other in the winding process, so that the outer circumferential surface of the pipe body 6 is not exposed. It should be noted that the shielding portion 7 is grounded at an appropriate position. In this manner, the shielding portion 7 is formed on the outer circumferential surface of the pipe body 6.

A protective portion 9 for the shielding portion 7 is arranged in the outermost layer of the shielded pipe 1, that is, on the outer circumferential surface of the shielding portion 7. The protective portion 9 of this embodiment is formed of a heat-shrinkable tube 10. The heat-shrinkable tube 10 sheathes the pipe body 6 provided with the shielding portion 7, and is formed to be long enough to cover substantially the entire length of the pipe body 6. When the heat-shrinkable tube 10 is heated, its diameter is reduced, thus making it possible to bring the heat-shrinkable tube 10 into intimate contact with the outer circumferential surface of the shielding portion 7 and to protect the shielding portion 7.

It should be noted that the heat-shrinkable tube 10 used in this embodiment is made of a material that is heat resistant, water resistant, and transparent. Therefore, not only can the heat-shrinkable tube 10 can be used to protect the shielding portion 7, including by providing rustproofing or the like of the shielding portion 7, but the transparency of the heat-shrinkable tube 10 also allows for visual confirmation of a condition of the ribbon-shaped metal foil 8 through the heat-shrinkable tube 10 from the outside.

Figure 3A:
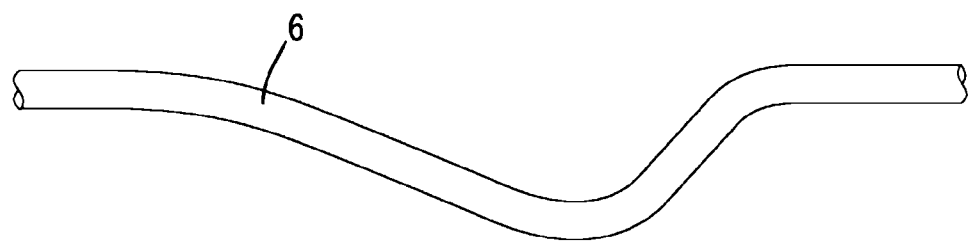
FIGS. 3(A), 3(B) and 3(C) show a manufacturing process of the shielded pipe.
Figure 3B:
Figure 3C:
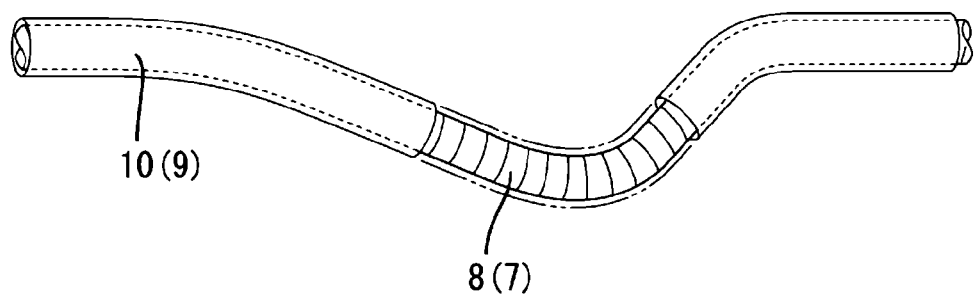

FIGS. 3(A) to 3(C) show a manufacturing process of the shielded pipe 1 of this embodiment. First, the pipe body 6 is shaped (see FIG. 3(A)). Examples of the shaping method include a method in which the pipe body 6 is shaped into a predetermined bent shape from the outset, and a method in which the pipe body 6 is shaped into a straight pipe shape by extrusion molding or the like, and then shaped into a predetermined shape by being locally heated.

Next, the ribbon-shaped metal foil 8 is spirally wound over the entire length of the pipe body 6 from one end side to the other end side of the pipe body 6. During the winding, the ribbon-shaped metal foil 8 adheres to the outer circumferential surface of the pipe body 6 with the lateral edges overlapping each other. Accordingly, the entire outer circumferential surface of the pipe body 6 is covered with the ribbon-shaped metal foil 8 without being exposed (see FIG. 3(B)).

The heat-shrinkable tube 10 sheathes the pipe body 6 provided with the shielding portion 7 in this manner from one end side in the longitudinal direction, and covers the range of substantially the entire length of the pipe body 6.

Thereafter, when the entire heat-shrinkable tube 10 is heated, the heat-shrinkable tube 10 is shrunk and covers the outer circumferential surface of the shielding portion 7 while following the outline shape of the pipe body 6. In this manner, the desired shielded pipe 1 is produced.

The following describes effects of the shielded pipe 1 produced as described above.

(1) Since the pipe body 6 (which is a main portion of the shielded pipe 1) is made of a synthetic resin material, its weight can be reduced compared with a conventional shielded pipe whose main portion is made of metal.

(2) For the same reason noted in (1), the bending processing can be easily performed, and the degree of freedom available with regard to the shape and the accuracy of dimensions can be improved.

(3) Since the shielding portion 7 is configured by spirally winding the ribbon-shaped metal foil 8, the shielding portion 7 can be easily configured regardless of the shape of the pipe body 6.

(4) Since the protective portion 9 is formed of the heat-shrinkable tube 10, the protective portion 9 will not be damaged from peeling (in contrast to a situation where, for example, the protective portion 9 is constituted by a coating or the like) and thus, the shielding portion 7 is highly protected. Moreover, even if a portion of the heat-shrinkable tube 10 tears and the shielding portion 7 is eroded by water infiltrating through such a torn portion, it is possible to prevent the breakage of the pipe body 6 since the pipe body 6 is made of a resin (unlike in the case where a shielded pipe made of metal is used).

(5) It is easy to adjust the shielding function by adjusting the thickness of the ribbon-shaped metal foil 8 or the number of times the ribbon-shaped metal foil 8 is wound around the pipe body 6.

Embodiment 2

Figure 5:
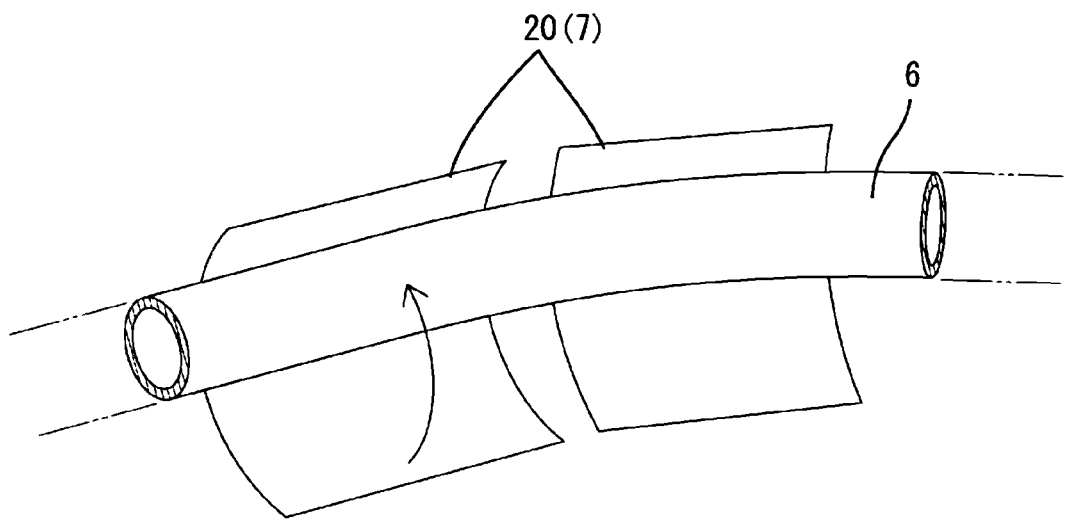
FIG. 5 is a perspective view showing a state in which sheet-like metal foils are wound around a pipe body in the shielded pipe according to Embodiment 2.

FIG. 5 shows Embodiment 2 of the present application. While the shielding portion 7 is constituted by the ribbon-shaped metal foil 8 in Embodiment 1, the shielding portion 7 of Embodiment 2 is instead configured by winding a plurality of sheet-like metal foils 20 around the outer circumferential surface of the pipe body 6. In the same manner as in Embodiment 1, the sheet-like metal foils 20 also adhere to the outer circumferential surface of the pipe body 6 via a bonding layer provided on their back surfaces.

In this embodiment, a plurality of types of the sheet-like metal foils 20 that differ in a width dimension (the width dimension being defined as the front-rear direction of the vehicle) are used. In particular, in the pipe body 6, sheet-like metal foils 20 having a longer width are attached to a long straight region, and sheet-like metal foils 20 having a shorter width are successively seamed together and attached to a bent region. Accordingly, the shielding portion 7 can be configured so as to follow the outline shape of the pipe body 6. Moreover, the time to wind the sheet-like metal foils 20 is shorter than the time to spirally wind the ribbon-shaped metal foil 8. Therefore, work efficiency can be improved. In addition, it is easy to adjust the shielding function by adjusting the thickness of the sheet-like metal foils 20 or the number of times the sheet-like metal foils 20 are wound around the pipe body 6.

The other configurations are the same as those of Embodiment 1, and therefore, the same operations and effects can be exhibited.

OTHER EMBODIMENTS

The present application is not limited to the embodiments that have been described using the foregoing description and the drawings. For example, embodiments as described below are also encompassed within the technical scope of the present application.

(1) Although the metal foils 8 and 20 having a bonding layer laminated on their back surfaces were shown as examples in the foregoing embodiments, the metal foils 8 and 20 may have no bonding layer and may instead be fixed to the pipe body 6 via a glue.

(2) Although Embodiment 1 describes the ribbon-shaped metal foil 8 being wound around the pipe body 6 with substantially no intervals between the lateral edges of the ribbon-shaped metal foil, the ribbon-shaped metal foil 8 may be wound with intervals between its lateral edges, as long as an appropriate shielding function can be obtained.

(3) Although the protective portion 9 was formed of the heat-shrinkable tube 10 in the foregoing embodiments, the protective portion 9 may be formed with the following methods instead of or together with that method:

(i) A tube made of a soft resin or rubber may sheathe the pipe body 6 provided with the shielding portion 7.

(ii) Similarly, a protective film may be formed on the outer circumferential surface of the shielding portion 7. For example, the shielding portion 7 may be coated with paint or a film that is formed by vapor deposition using a synthetic resin, metal, or the like as a vapor deposition material.

(4) Although the foregoing embodiments describe a pipe body 6 made of a synthetic resin material, the synthetic resin material may be mixed with a conductive resin material and shaped accordingly. Thus, improvement in the shielding function can be expected.

(5) Although the foregoing embodiments describe a shielded pipe 1 that is constituted by one seamless pipe, the shielded pipe 1 may be configured by connecting a plurality of pipes.

(6) It is preferable to color the heat-shrinkable tube orange to indicate that high-voltage electrical wires are inserted into the heat-shrinkable tube.

LIST OF REFERENCE NUMERALS

1 . . . Shielded pipe
6 . . . Pipe body
7 . . . Shielding portion
8, 20 . . . Metal foil
9 . . . Protective portion
10 . . . Heat-shrinkable tube

The invention claimed is:

1. A shielded pipe for a vehicle, the shielded pipe being configured to receive an electric wire, and the shielded pipe comprising:
   a pipe body made of a synthetic resin material;
   a shielding portion formed by winding a plurality of sheet-like metal foils around an outer circumferential surface of the pipe body; and
   a protective portion formed on an outer circumference of the shielding portion, wherein
   the shielding portion is formed by winding the plurality of sheet-like metal foils around the pipe body with the sheet-like metal foils being successively seamed together; the plurality of the sheet-like metal foils differ in a width dimension; the pipe body includes a straight region and a bent region;
   the pipe body includes a straight region and a bent region;
   the sheet-like metal foils having a longer width are wound around the straight region; and
   the sheet-like metal foils having a shorter width are wound around the bent region.

2. The shielded pipe according to claim 1, wherein the protective portion is a heat-shrinkable tube that sheathes the pipe body.

3. The shielded pipe according to claim 1, wherein the protective portion is a film that is laminated on the outer circumferential surface of the shielding portion, the film having a rustproofing function.

\* \* \* \* \*